United States Patent
Lee et al.

(10) Patent No.: US 11,949,324 B2
(45) Date of Patent: Apr. 2, 2024

(54) OVERCURRENT PROTECTION INVERTER

(71) Applicant: LS ELECTRIC CO., LTD., Anyang-si (KR)

(72) Inventors: Jae-Moon Lee, Anyang-si (KR); Chun-Suk Yang, Anyang-si (KR); Tae-Suk Bae, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 277 days.

(21) Appl. No.: 17/602,907

(22) PCT Filed: Mar. 17, 2020

(86) PCT No.: PCT/KR2020/003655
§ 371 (c)(1),
(2) Date: Oct. 11, 2021

(87) PCT Pub. No.: WO2020/209516
PCT Pub. Date: Oct. 15, 2020

(65) Prior Publication Data
US 2022/0200440 A1    Jun. 23, 2022

(30) Foreign Application Priority Data
Apr. 11, 2019   (KR) .................. 10-2019-0042511

(51) Int. Cl.
*H02M 1/32*       (2007.01)
*H02M 7/5387*   (2007.01)
(Continued)

(52) U.S. Cl.
CPC ......... *H02M 1/32* (2013.01); *H02M 7/53871* (2013.01); *H02P 27/08* (2013.01); *H02P 29/027* (2013.01)

(58) Field of Classification Search
CPC .......... H02M 1/32; H02M 1/325; H02M 1/38; H02P 29/027; H02P 29/024; H02P 29/02;
(Continued)

(56) References Cited

U.S. PATENT DOCUMENTS 7,417,554 B2   8/2008  Benke et al.
10,014,764 B1  7/2018  Lee et al.
(Continued)

FOREIGN PATENT DOCUMENTS

CN   101813750 A    8/2010
JP   2006310133 A   11/2006
(Continued)

OTHER PUBLICATIONS

International Search Report for related International Application No. PCT/KR2020/003655; report dated Oct. 15, 2020; (5 pages).
(Continued)

*Primary Examiner* — Nguyen Tran
(74) *Attorney, Agent, or Firm* — K&L Gates LLP

(57) ABSTRACT

The present disclosure relates to an overcurrent protection inverter, and more particularly, to an inverter, which uses a leg-shunt resistor so as to detect an instantaneous maximum output current and an AD current, thereby performing an inverter protection operation. The present disclosure detects the instantaneous maximum output current and detects the AD current from the leg-shunt resistor so as to perform an overcurrent protection operation when an overcurrent occurs in the entire inverter operation section, thereby enabling protection of the inverter.

3 Claims, 19 Drawing Sheets

(51) Int. Cl.
*H02P 27/08* (2006.01)
*H02P 29/024* (2016.01)

(58) Field of Classification Search
CPC ........ H02P 27/08; H02P 27/085; H02P 27/06; H02P 27/04; H02P 27/02
See application file for complete search history.

(56) References Cited

U.S. PATENT DOCUMENTS

| | | |
|---|---|---|
| 10,615,683 B2 | 4/2020 | Yang et al. |
| 2016/0141117 A1 | 5/2016 | Ashtekar et al. |
| 2020/0287482 A1* | 9/2020 | Yoneda ..................... B25F 5/00 |
| 2020/0382042 A1* | 12/2020 | Nakayama .............. H02P 23/14 |

FOREIGN PATENT DOCUMENTS

| | | |
|---|---|---|
| KR | 20160021663 A | 2/2016 |
| KR | 20180107547 A | 10/2018 |

OTHER PUBLICATIONS

Written Opinion for related International Application No. PCT/KR2020/003655; report dated Oct. 15, 2020; (4 pages).

* cited by examiner

FIG. 14
(PRIOR ART)

OVERCURRENT PROTECTION INVERTER

CROSS-REFERENCE TO RELATED APPLICATIONS

This application is the National Stage filing under 35 U.S.C. 371 of International Application No. PCT/KR2020/003655, filed on Mar. 17, 2020, which claims the benefit of earlier filing date and right of priority to Korea utility model Application No. 10-2019-0042511 filed on Apr. 11, 2019, the contents of which are all hereby incorporated by reference herein in their entirety.

FIELD

The present disclosure relates to an overcurrent protection inverter, particularly, to an inverter that detects an instantaneous maximum output current and an AD current using a leg-shunt resistor and thus performs an inverter protection operation based on the detection result.

BACKGROUND

An inverter refers to a device that converts DC power into AC power of target frequency and magnitude, and is used to control AC motors. This inverter may be controlled using a variable voltage variable frequency (VVVF) scheme, and may vary voltage and frequency input to the motor based on a pulse width modulation (PWM) output.

FIG. 10 is a configuration diagram of a general inverter according to a prior art.

Referring to FIG. 10, an inverter 1 according to the prior art receives AC power of three-phases from a power supply (three-phases power) 2. A rectifier 11 rectifies the AC power. Then, a smoothing unit 12 smooths DC voltage received from the rectifier 11 and stores therein the smoothed DC voltage. An inverting unit 13 convert the DC voltage stored in a DC link capacitor as the smoothing unit 12 to AC voltage having a predetermined voltage and frequency, based on a PWM control signal and provides the AC voltage to a motor 3. The inverting unit 13 is composed of three-phases legs, and each leg is composed of two switching elements connected in series with each other.

To protect the inverter from overcurrent, overcurrent detection is required. For such overcurrent detection, a current sensor (current transformer: CT) is disposed on an output A of the inverter 1 to detect inverter output current. Alternatively, a leg-shunt resistor connected in series with each of switching elements of a lower leg B of the inverting unit 13 is disposed. Thus, output current of the inverting unit 13 is detected using the resistor and thus the overcurrent is detected. In this connection, generally, instantaneous maximum current of the output current is detected to perform overcurrent protection operation.

FIG. 11 is an exemplary diagram to illustrate a scheme for detecting inverter output current using a leg-shunt resistor according to the prior art.

Referring to FIG. 11, in the current detection scheme using the leg-shunt resistor, each leg-shunt resistor 20 is connected to an emitter of a lower switching element (e.g., an insulated gate bipolar transistor (IGBT) of each leg of the inverting unit 13 of the inverter 1. Thus, current flowing through each leg-shunt resistor 20 is detected. However, the output current is discontinuously detected according to a switching state of the switching element of the inverting unit 13. Thus, detection of instantaneous maximum current based on the switching state of the switching element is required.

FIG. 12 is a state diagram of inverter output current based on a switching state in space vector pulse width modulation (SVPWM) control in a prior art. FIG. 13 shows an operation of the switching element based on an inverter switching state in a prior art. FIG. 13 shows a definition of an operation of a switching element of each phase, based on the switching state of FIG. 12.

Figure 14:
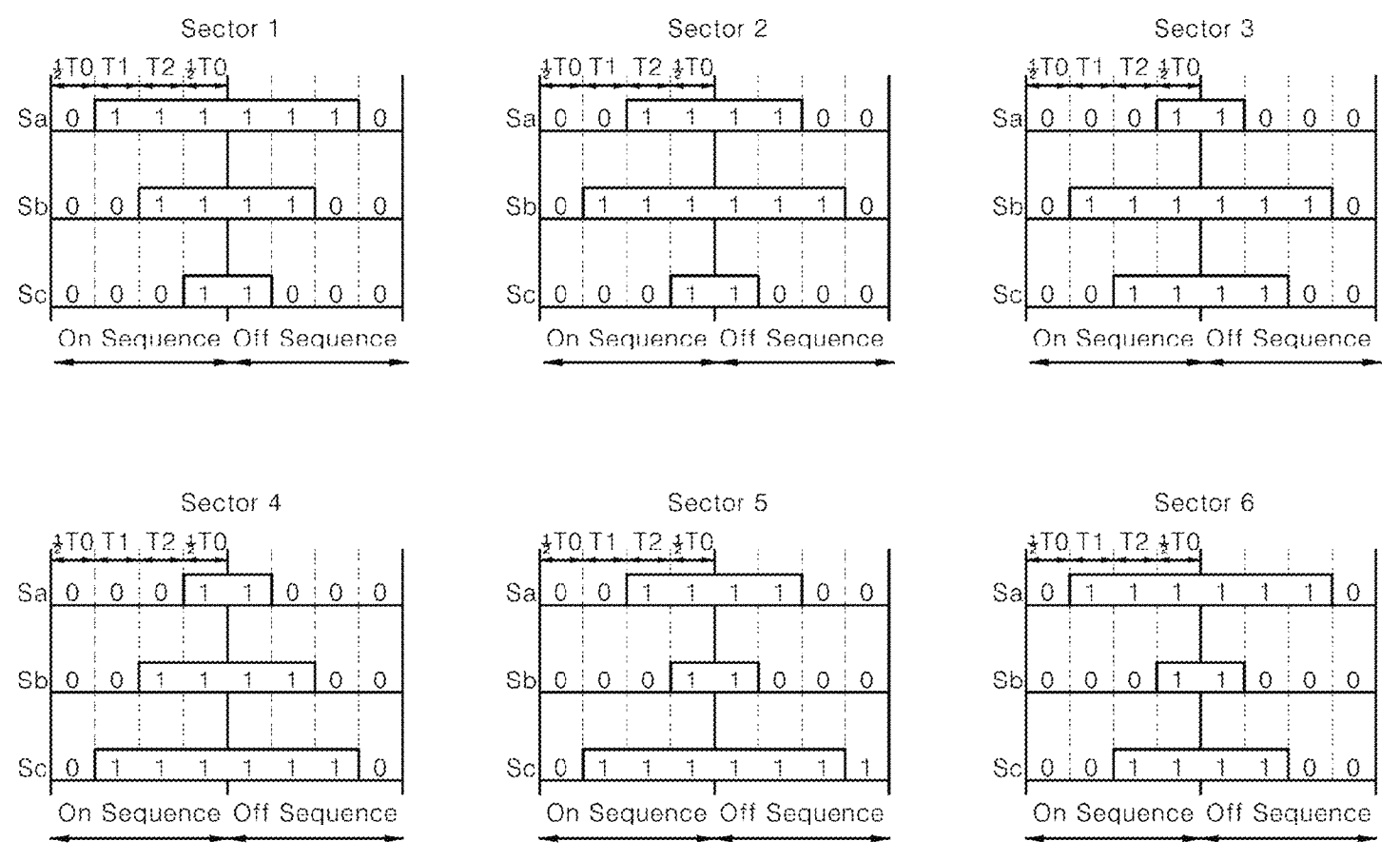

FIG. 14 is a schematic diagram of an operation of a switching element based on the SVPWM sector in a prior art. An operation of the switching element in SVPWM control is divided into an operation for a zero vector period composed of a T0 period and an operation in an active vector period composed of T1 and T2 periods.

FIG. 15 is a configuration diagram of an inverter overcurrent protection system in a leg-shunt resistor current detection scheme according to a prior art. FIG. 16 is a detailed configuration diagram of a peak current detector of FIG. 15. FIG. 17 is a diagram showing an output current path based on an inverter operation mode in a prior art.

The inverter operation mode is divided into a powering mode in which the inverter output current increases and a freewheeling mode in which the inverter output current is extinguished. The powering mode occurs for an SVPWM active vector period, and the freewheeling mode occurs for a SVPWM zero vector period.

Referring to FIG. 15, the inverter protection system for overcurrent protection of a general-purpose inverter includes a current detector 30 that detects current output from a leg-shunt resistor 20, a peak current detector 100 that detects instantaneous maximum output current, and an overcurrent protector 50 that protects overcurrent.

The current detector 30 offsets and aligns and amplifies the current output from the leg-shunt resistor 20, and the peak current detector 40 detects the peak current as the instantaneous maximum output current. Then, the overcurrent protector 50 performs an overcurrent suppression (OCS) operation that temporarily blocks PWM input of the switching element of the inverting unit 13 or an over-current trip (OCT) operation that generates an inverter trip, based on the instantaneous maximum output current as detected.

In the current detection scheme using the leg-shunt resistor, the current detection is possible only for a period for which the current is conducted through the switching element of the lower leg of the inverting unit 13. Thus, the inverter's output current is discontinuously detected as shown in FIG. 6.

The current detector 30 adds an offset to the current detected at the leg-shunt resistor 20 and amplifies the same and inputs the same to the peak current detector 40. Referring to FIG. 16, a rectifier 41 of the peak current detector 40 outputs a waveform of a full wave rectified current, and an inverting amplifier 42 inverts a negative signal into a positive signal and output the inverted signal (④ in FIG. 6).

The overcurrent protector 50 analyzes a level of the input signal and generates OCS or OCT based on the level of the input instantaneous maximum output current.

As shown in FIG. 17, output current of the inverting unit 13 is divided into that in the powering mode in which energy is transferred from the DC link capacitor as the smoothing unit 12 to the inverting unit 13 and thus the output current increases, and that in the freewheeling mod in which energy of the motor 2 is extinguished, based on the switching operation of the inverter.

The freewheeling mode is divided into a first mode in which the SVPWM zero vector is applied to extinguish energy between inverting unit 13 and the motor 3, and a second mode in which in the OCS operation, all switching elements are cut off to extinguish energy between the motor 3 and the DC link capacitor as the smoothing unit 12.

The powering mode occurs for the period for which an active vector is applied in SVPWM. The output current increases when the SVPWM active vector is applied. In an overload situation, the output current continuously increases. When the output current exceeds an overcurrent protection level, an overcurrent protection operation is performed. However, in the freewheeling mode for extinguishing the current generated in the powering mode, the output current does not increase.

In the conventional current detection scheme using the leg-shunt resistor, the peak current detector 40 may limitedly detect the peak current, based on the switching state of the switching element of the inverting unit 13.

That is, referring to FIG. 14, SVPWM is composed of two zero vector periods composed of T0 and two active vector periods composed of T1 and T2 for one PWM period. The T1 period is a period for which output current paths to the lower switching elements of the two-phases of the inverting unit 13 are generated, and the T2 period is a period for which the output current path to the lower switching element of one-phase of the inverting unit 13 is generated. In this connection, for the T2 period, an entirety of the instantaneous maximum output current is applied through one lower switching element, and thus the instantaneous maximum output current may be easily detected. However, for the T1 period, the instantaneous maximum output current is divided into two halve, which are applied to the two lower switching elements, respectively. Thus, the instantaneous peak current is reduced by ½, and thus the instantaneous maximum output current may not be detected.

Thus, the overcurrent is not suppressed in an overcurrent situation in a portion of the powering mode period, resulting in a problem that the output current exceeds the overcurrent protection level. When the overcurrent exceeding a design value occurs, thermal stress is increased on the switching element due to the overcurrent, and thus, the switching element may be damaged or a trip may occur due to an overheated situation.

FIG. 18 is a configuration diagram of an inverter based on a maximum output current detection scheme (OP-AMP Adder scheme) according to a prior art. FIG. 19 is a current waveform of the inverter in which the overcurrent is not detected, based on the maximum output current detection scheme according to the prior art.

In order to solve the above problem, the maximum output current detection scheme has been proposed. As shown in FIG. 18, a system for implementing this scheme may include a current detector 30 which detects the output current flowing through the leg-shunt resistor of the inverter 1, an instantaneous maximum output current detector 100 that detects an instantaneous maximum output current from the output current detected by the current detector 30, and an overcurrent protector 50 that performs an overcurrent protection operation based on the detected instantaneous maximum output current.

However, referring to FIG. 19, even in this case, the instantaneous maximum output current may not be limited for the zero vector period. In a low-speed operation condition with a high carrier and low use of voltage, a short active vector period is applied. In this condition, when an overcurrent by the active vector occurs, the overcurrent may not be detected within the active vector period due to a current detection delay factor such as an input filter, and a period proceeds to a zero vector period. Therefore, in the instantaneous maximum output current detection scheme using the OP-AMP Adder, the instantaneous maximum current detection for the zero vector period is limited. Thus, the overcurrent detection cannot be performed until a next active vector period is sufficiently secured.

Therefore, an inverter that may detect the overcurrent for all of periods and protect the inverter from the overcurrent is required.

SUMMARY

A purpose of the present disclosure is to provide an inverter that may detect an accurate instantaneous maximum output current in a freewheeling mode period and a powering mode period of the inverter and thus perform an overcurrent protection operation when an overcurrent occurs.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

The present disclosure provides an overcurrent protection inverter comprising: an inverting unit including two switching elements connected in series with each of legs; each leg-shunt resistor connected in series with a switching element of a lower leg of each leg of the inverting unit; a current detector configured to detect each output current from each signal output from each leg-shunt resistor; an instantaneous maximum output current detector configured to add the output currents received from the current detector to each other to output instantaneous maximum output current of output current of the inverting unit; and a controller configured to: when each of AD current detected by the current detector and the instantaneous maximum output current detected by the instantaneous maximum output current detector is equal to or greater than reference current, perform an overcurrent protection operation for protecting the inverting unit from overcurrent.

The controller is configured to: when each of the AD current and the instantaneous maximum output current are equal to or greater than an OCS (over-current suppression) level, perform an OCS operation to temporarily block a PWM input of the inverting unit; or when each of the AD current and the instantaneous maximum output current are equal to or greater than a OCT (over-current trip) level, perform an OCT operation to generate an inverter trip, wherein a magnitude of reference current for the OCS level is lower than a magnitude of reference current for the OCT level.

The overcurrent protection inverter comprises an overcurrent protection circuit configured to: when the instantaneous maximum output current detected by the instantaneous maximum output current detector is equal to or higher than the OCS level, transmit, to the controller, an OCS operation signal to temporarily block a PWM input of the switching element; or when the instantaneous maximum output current is equal to or higher than the OCT level, transmit, to the controller, an OCT operation signal to generate the inverter trip.

The instantaneous maximum output current detector includes an operational amplifier.

The overcurrent protection inverter according to the present disclosure may detect the instantaneous maximum output current and detect the AD current at the leg-shunt resistor and thus may perform the overcurrent protection operation when an overcurrent occurs for an entire operation period of the inverter, thereby protecting the inverter.

The above-described effects, and specific effects of the present disclosure as not mentioned above will be described based on specific details for carrying out the disclosure.

BRIEF DESCRIPTION OF THE DRAWINGS

FIG. 14 is a schematic diagram of an operation of a switching element based on the SVPWM sector in a prior art.

DETAILED DESCRIPTION

Figure 1:
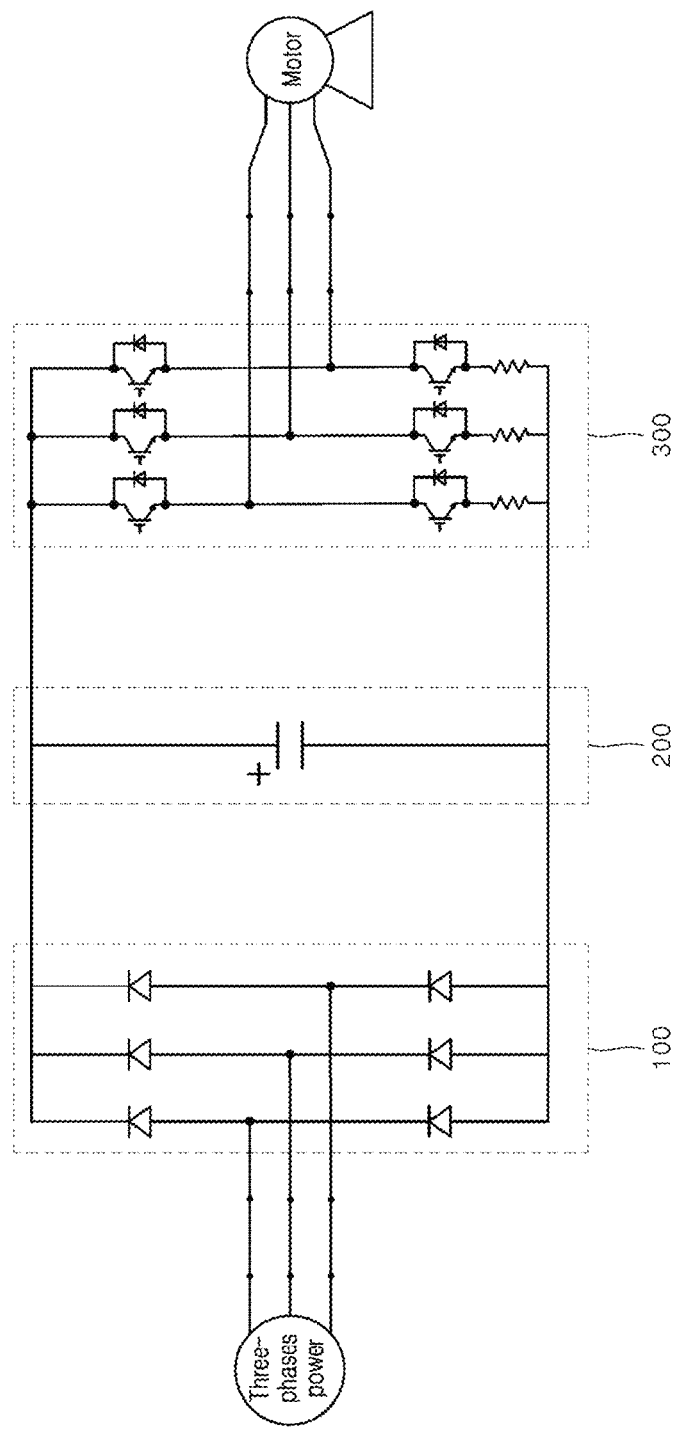
FIG. 1 is a circuit diagram of an overcurrent protection inverter according to the present disclosure.

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a known component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

Hereinafter, an overcurrent protection inverter according to some embodiments of the present disclosure will be described.

Figure 2:
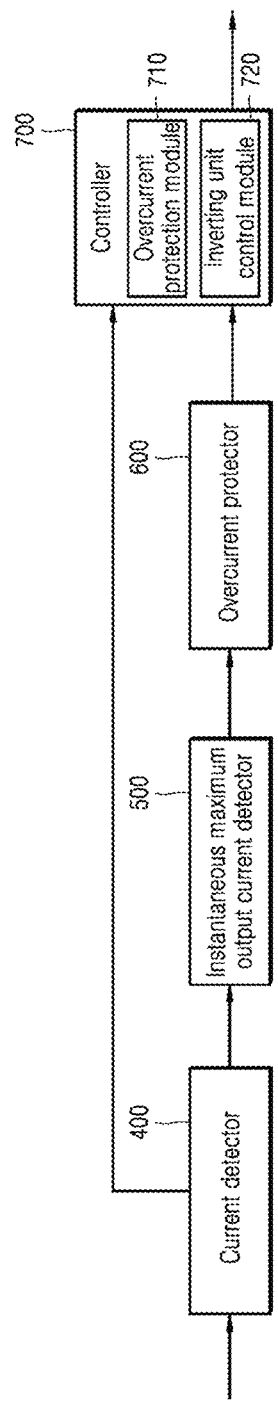
FIG. 2 is a block diagram of an overcurrent protection configuration of an overcurrent protection inverter according to the present disclosure.

FIG. 1 is a circuit diagram of an overcurrent protection inverter according to the present disclosure. FIG. 2 is a block diagram of an overcurrent protection configuration of an overcurrent protection inverter according to the present disclosure.

As shown in FIG. 1 and FIG. 2, the overcurrent protection inverter according to the present disclosure includes a rectifier 100 for rectifying three-phases power, a smoothing unit 200 for smoothing current output from the rectifier 100, an inverting unit 300 which outputs current from the smoothing unit 200 to a motor, based on control from the controller 700, a current detector 400 for detecting an output current from a leg-shunt resistor of the inverting unit 300, an instantaneous maximum output current detector 500 for detecting an instantaneous maximum output current from the output current detected by the current detector 400, an overcurrent protector 600 that allows the controller to perform an overcurrent protection operation based on the instantaneous maximum output current detected by the instantaneous maximum output current detector 500, and the controller 700 that controls the inverting unit 300 and performs the overcurrent protection operation based on an AD output current and the instantaneous maximum output current. In this connection, descriptions of the rectifier 100, the smoothing unit 200, and the inverting unit 300 are the same as those in a general inverter. Thus, the descriptions thereof will be omitted.

The current detector 400 detects the output current from the shunt resistor connected to a switching element of a lower leg of the inverting unit 300. The current detected by the current detector 400 is transmitted to the controller 700 and the instantaneous maximum output current detector 500 to be described later.

Figure 3:
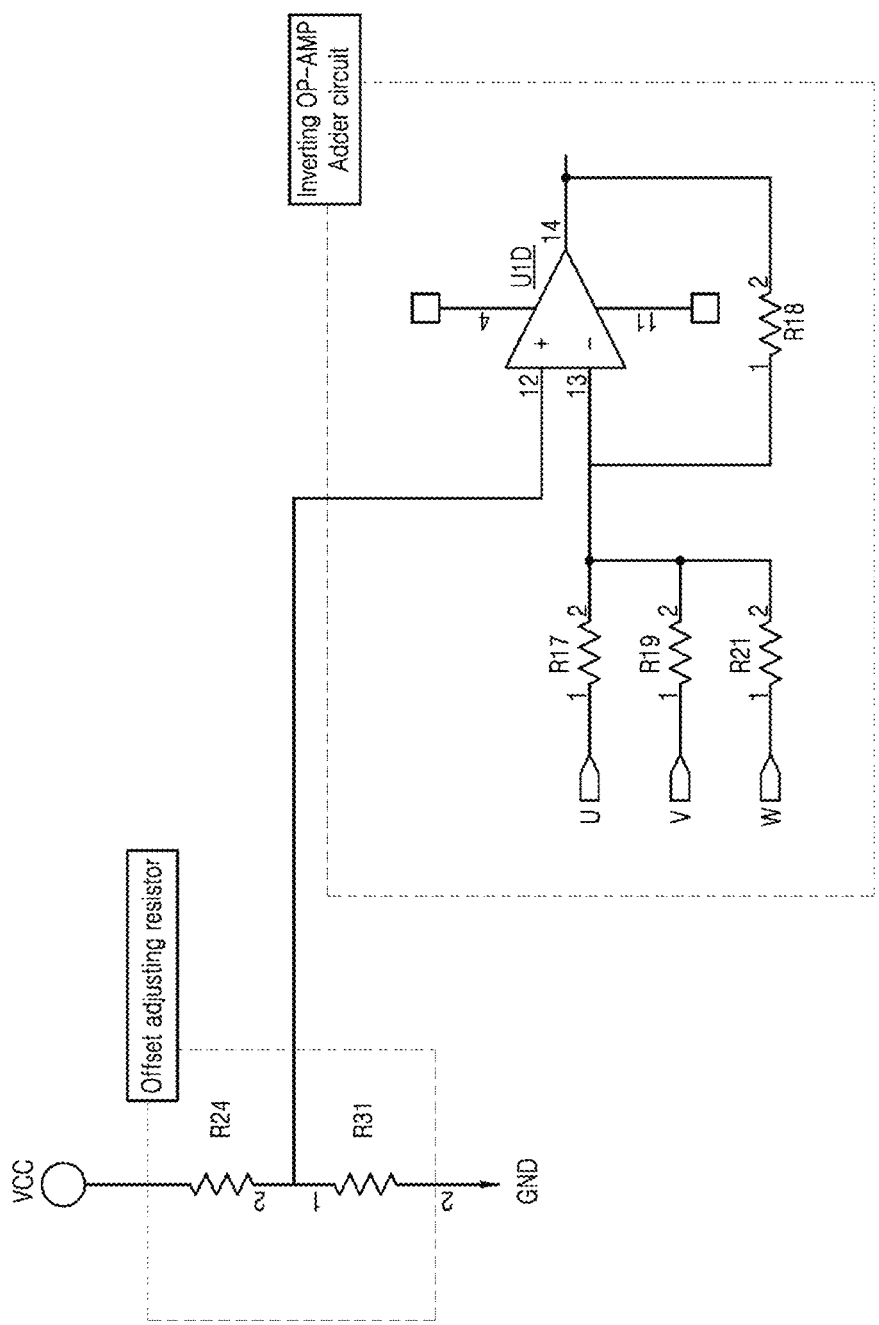
FIG. 3 is a circuit diagram of an instantaneous maximum output current detector in an overcurrent protection inverter according to the present disclosure.

FIG. 3 is a circuit diagram of an instantaneous maximum output current detector in an overcurrent protection inverter according to the present disclosure.

The instantaneous maximum output current detector 500 detects an instantaneous maximum output current from the output current detected by the current detector 400. For this purpose, the instantaneous maximum output detector 500 includes an offset adjusting module 510 and an amplification adding module 520.

The offset adjusting module 510 adjusts a magnitude of an offset voltage of the amplification adding module 520 using an offset adjusting resistor as shown in FIG. 3. More specifically, the offset adjusting module 510 may adjust the offset voltage using two resistors. The offset voltage refers to a voltage used to remove DC voltage generated in the amplification adding module 520 as an analog circuit. The offset adjusting module 510 delivers the offset voltage that is used to remove the DC voltage to the amplification adding module 520.

The amplification adding module 520 may include an OP-AMP. An inverting unit output current of three-phases is input to an inverting terminal of the OP-AMP. However, the present disclosure is not limited thereto. In another example, the inverting unit output current of the three-phases may be input to a non-inverting terminal of the OP-AMP. For a SVPWM active vector period, a current path to the lower leg switching element of one-phase or current paths to the lower leg switching elements of two-phases of the inverting unit 300 may be generated. In a SVPWM T2 period in which a current path to one-phase lower leg switching element is generated, a path of inverter peak current to the one-phase lower leg switching element may be generated. Further, for a T1 period when the current paths to the lower leg switching elements of two-phases are generated, a path of the inverter peak current to an upper leg switching element of one-phase may be generated. According to Kirchhoff's Current Law (KCL), the inverter peak current is equal to a sum of currents flowing through the lower leg switching elements. According to the present disclosure, the instantaneous maximum output current detector 500 including the amplification adding module 520 may take the inverter output current of one-phase or two-phases for the active vector period as an input thereto and thus detect the instantaneous maximum output current. Thus, the instantaneous maximum output current may be detected for both a period (T2 period) for which the current path to the switching element of the lower leg of one-phase is generated and a period (T1 period) when the current paths to the switching elements of the lower legs of the two-phases are generated, that is, for an entirety of the powering mode period.

Figure 4:
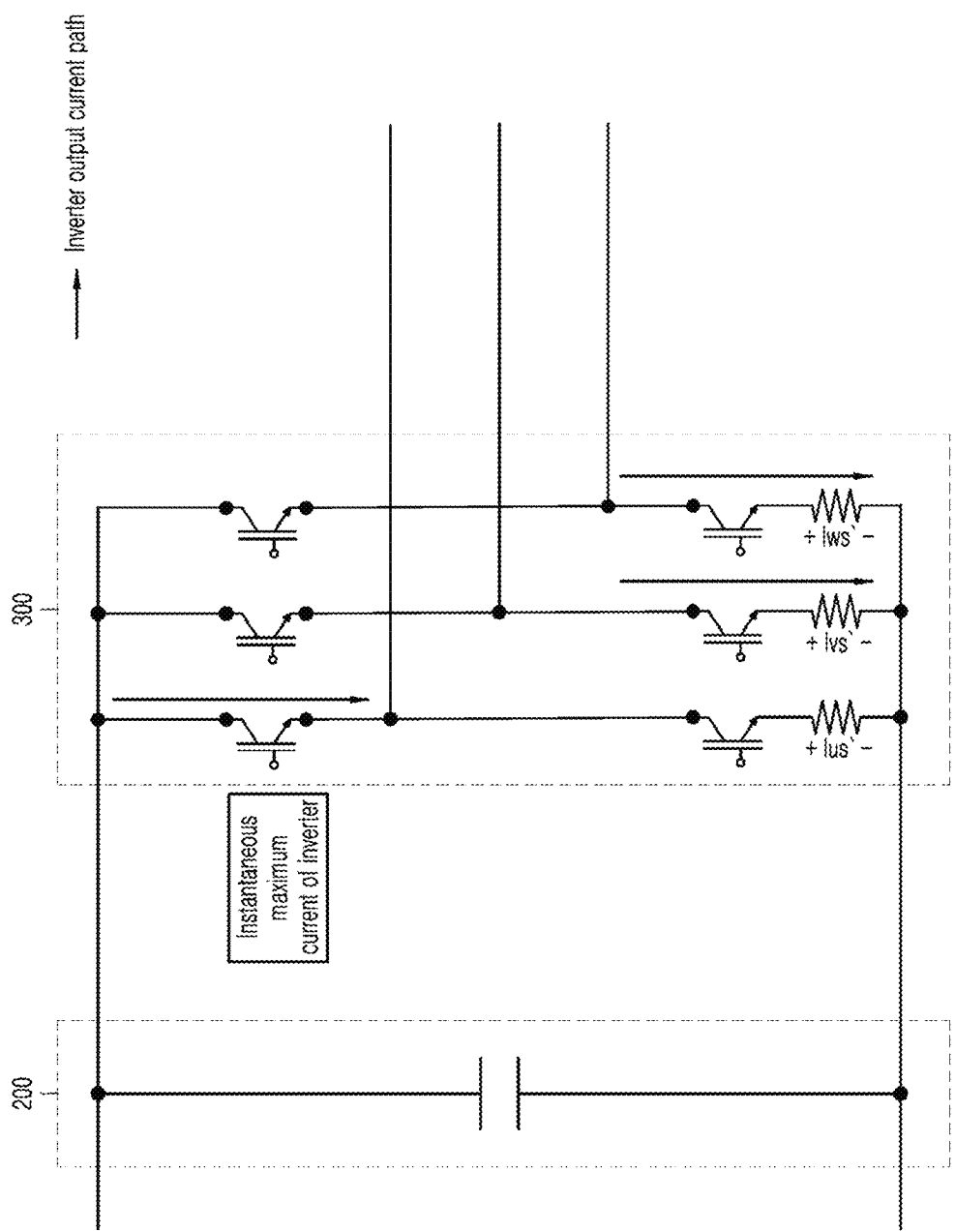
FIG. 4 and FIG. 5 are circuit diagrams showing a current path in a SVPWM sector 1 in an overcurrent protection inverter according to the present disclosure.
Figure 5:
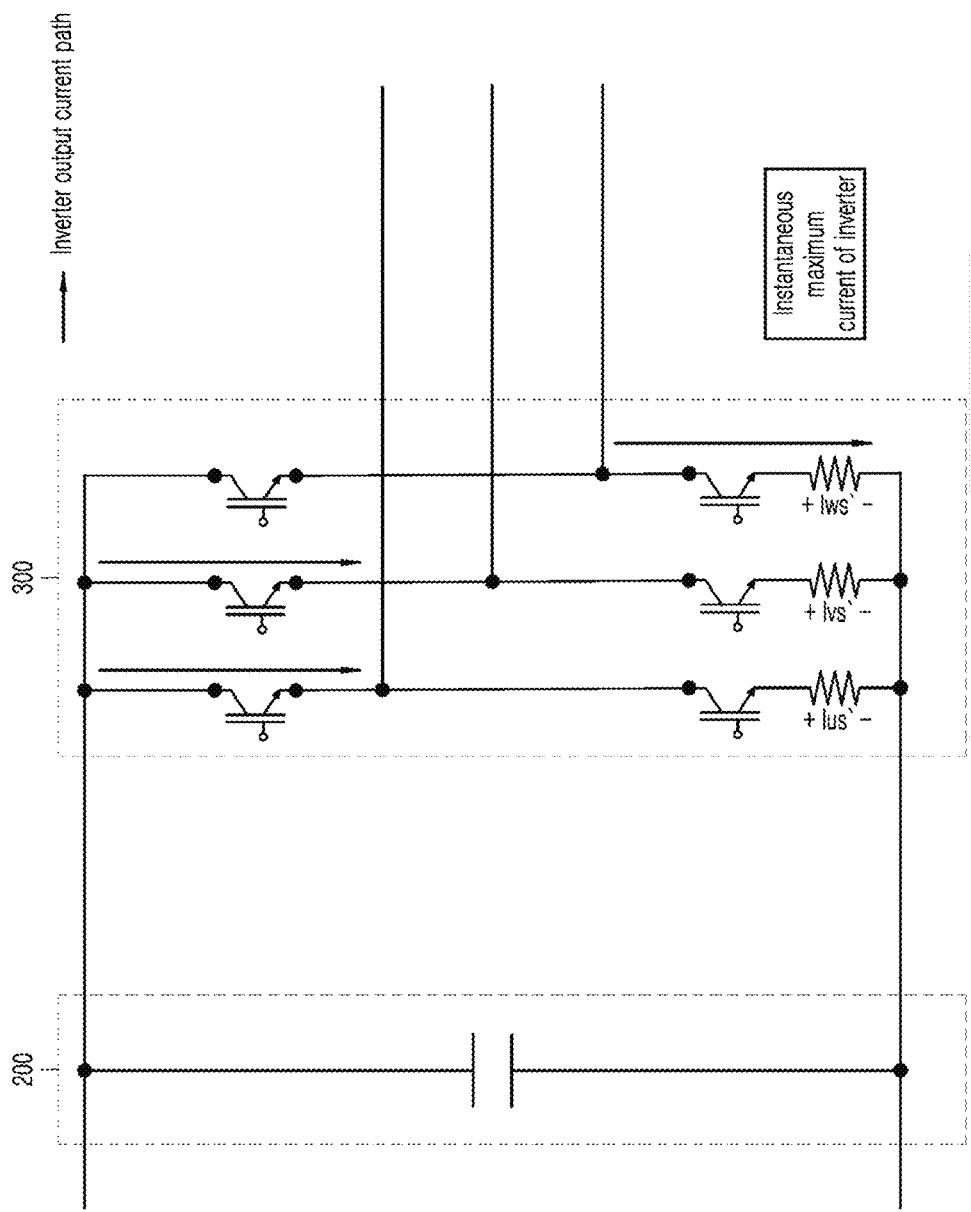

FIG. 4 and FIG. 5 are circuit diagrams showing a current path in a SVPWM sector 1 in the overcurrent protection inverter according to the present disclosure. FIG. 4 shows the T1 period for which the current paths to the switching elements of the lower legs of the two-phases of the inverting unit are generated. FIG. 5 shows the T2 period for which the current path to the switching element of the lower leg of one-phase of the inverting unit is generated.

Referring to FIG. 4, for the T1 period for which the current paths to the switching elements of the V-phase and W-phase lower legs, and a current path to a switching element of the U-phase upper leg is generated, the current detector 400 detects V-phase current and W-phase current, and does not detect U-phase current. In this connection, the instantaneous maximum output current has the U-phase. The V-phase and W-phase currents as detected by the current detector 400 are input to the instantaneous maximum output current detector 500, and are added to each other by the amplification adding module 520 to output the U-phase current as the instantaneous maximum output current. The U-phase instantaneous maximum output current may be input to the overcurrent protector 600. In another example, the instantaneous maximum output current may be detected in each of the SVPWM sector 2 to sector 6 in the same manner as the above description.

Referring to FIG. 5, for the T2 period for which the current path to the switching element of the W-phase lower leg, the current detector 400 detects the W-phase current, but does not detect the U-phase current and the V-phase current. In this connection, the instantaneous maximum output current has the W-phase. The instantaneous maximum output current detector 500 may receive the W-phase current and detect the instantaneous maximum output current, and output the W-phase instantaneous maximum output current to the overcurrent protector 600.

The overcurrent protector 600 may be embodied as an overcurrent protection circuit, and may receive the instantaneous maximum output current from the instantaneous maximum output current detector 500 and may perform an overcurrent protection operation based on the detected instantaneous maximum output current. In this connection, the overcurrent protector 600 transmits, to the controller 700, a signal for the overcurrent protection operation based on the detected instantaneous maximum output current. Further, the controller 700 performs the actual overcurrent protection operation. Specifically, the overcurrent protector 600 may receive the instantaneous maximum output current of the switching element of the inverting unit 300 from the instantaneous maximum output current detector 500 and may deliver, to the controller 700, an OCS operation signal that temporarily cuts off the PWM input of the switching element of the inverting unit 300 or an OCT operation signal that generates an inverter trip, based on the detected instantaneous maximum output current.

That is, the instantaneous maximum output current detector 500 according to the present disclosure may detect the inverter instantaneous maximum output current for an entirety of the active vector period. Thus, the overcurrent protector 600 may stably perform the overcurrent protection operation for an entirety of the inverter powering mode period.

The controller 700 controls an actual operation of the inverting unit 300 based on the AD current transmitted from the current detector 400 and the OCS operation signal or the OCT operation signal transmitted from the overcurrent protector 600. The controller 700 includes an overcurrent protection module 710 that performs the overcurrent protection operation, and an inverting unit control module 720 that controls the inverting unit 300.

Figure 6:
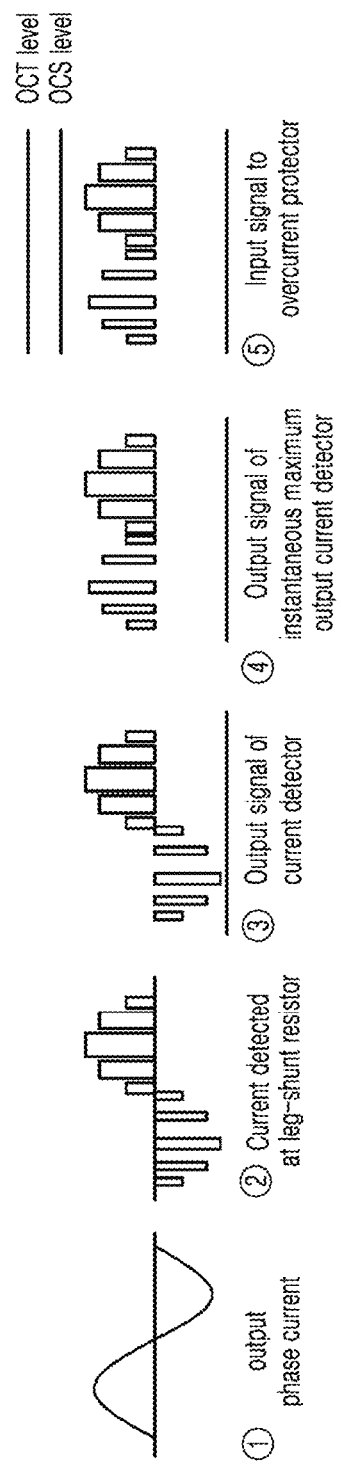
FIG. 6 is a diagram for illustrating an overcurrent protection operation based on a waveform output from an overcurrent protection inverter according to the present disclosure.
Figure 7:
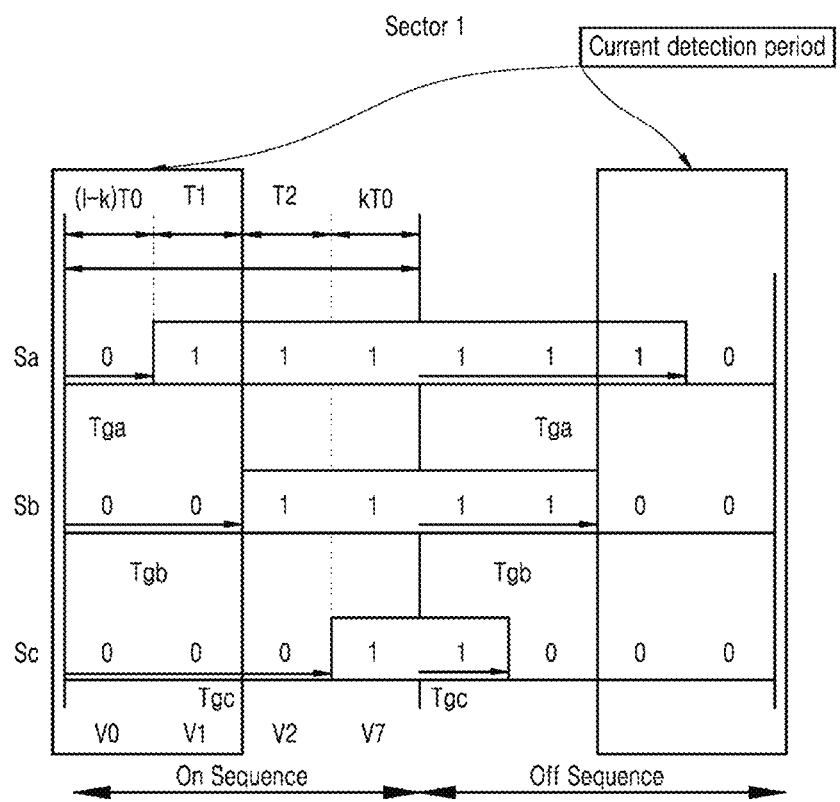
FIG. 7 is a table of a period for which AD current may be detected in an overcurrent protection inverter according to the present disclosure.
Figure 8:
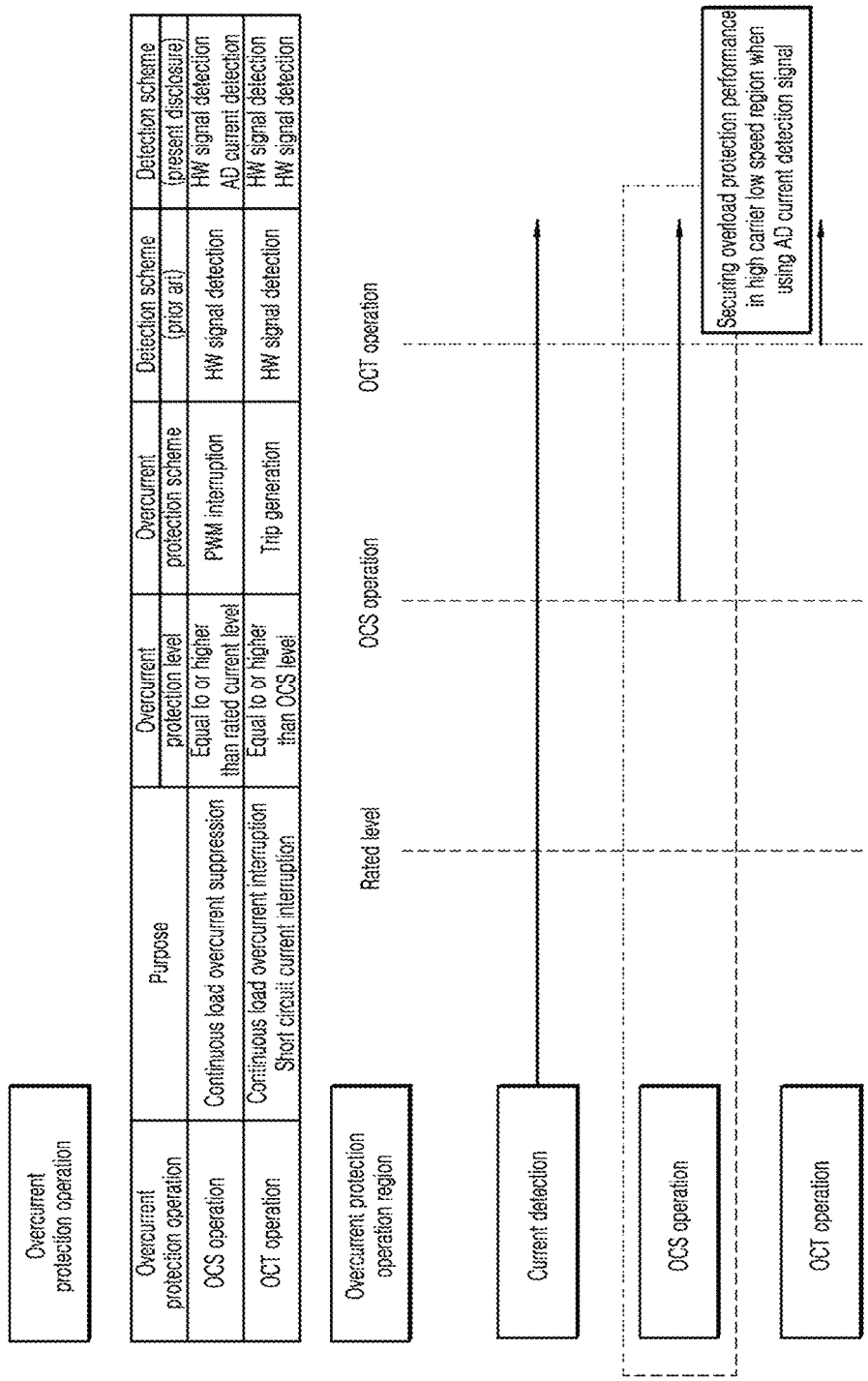
FIG. 8 is a comparison diagram between overcurrent protection operations of overcurrent protection inverters according to the prior art and the present disclosure.

FIG. 6 is a diagram for illustrating the overcurrent protection operation based on a waveform output from the overcurrent protection inverter according to the present disclosure. (a) in FIG. 6 shows an output phase current of the inverting unit 13, and (b) in FIG. 6 shows a detected current at the shunt resistor. Further, (c) in FIG. 6 shows an output signal of the current detector 30, and (d) in FIG. 6 shows an output signal of the instantaneous maximum output current detector. Finally, (e) in FIG. 6 shows an output signal of the overcurrent protector 50. Further, FIG. 7 is a table of a period for which the AD current may be detected in the overcurrent protection inverter according to the present disclosure. FIG. 8 is a comparison diagram between overcurrent protection operations of overcurrent protection inverters according to the prior art and the present disclosure.

Referring to FIG. 6, the overcurrent protection module 710 performs the overcurrent protection operation based on the AD current transmitted from the current detector 400 and the OCS operation signal or OCT operation signal transmitted from the overcurrent protector 600. That is, when the AD current delivered from the current detector 400 is equal to or greater than an OCS level, or the instantaneous maximum output current transferred from the instantaneous maximum output current detector 500 is greater than or equal to the OCS level (in an event of receiving the OCS operation signal), the overcurrent protection module 710 may allow the inverting unit control module 720 to perform the OCS operation that temporarily cuts off the PWM input of the inverting unit 300. Further, when the AD current transmitted from the current detector 400 is equal to or greater than an OCT level, or the instantaneous maximum output current transmitted from the instantaneous maximum output current detector 500 is equal to or greater than the OCT level (in an event of receiving the OCT operation signal), the overcurrent protection module 710 may allow the inverting unit control module 720 to perform the OCT operation that generates an inverter trip. As shown in FIG. 7, the inverter according to the present disclosure detects the AD current and thus exhibits good current detection performance for the zero vector period and may reliably detect the overcurrent detection for the freewheeling mode period that occurs in the zero vector after the occurrence of the overcurrent. Further, the inverter according to the present disclosure detects the instantaneous maximum output current and thus exhibits good current detection performance even for the active vector period. That is, as shown in FIG. 8, the inverter according to the present disclosure has a combination of a software structure in which the controller determines the AD current to control the inverting unit 300 and a hardware structure using the OP-AMP, thereby obtaining overload protection performance in a high carrier low speed region. This may be summarized in a table as follows.

Table 1 is a current detection performance table based on a SVPWM switching state.

TABLE 1

| Sa | 0 | 1 | 1 | 1 | 1 | 1 | 0 |
|---|---|---|---|---|---|---|---|
| Sb | 0 | 0 | 1 | 1 | 1 | 0 | 0 |
| Sc | 0 | 0 | 0 | 1 | 0 | 0 | 0 |
| Vector | 000 | 100 | 110 | 111 | 110 | 100 | 000 |
| AD current detection scheme | Good | Good | Poor | Impossible | Poor | Good | Good |
| Rectifying circuit scheme | Good | Poor | Good | Impossible | Good | Poor | Good |
| Maximum output current detection scheme | Impossible | Good | Good | Impossible | Good | Good | Impossible |
| Present disclosure | Good | Good | Good | Impossible | Good | Good | Good |

Figure 9:
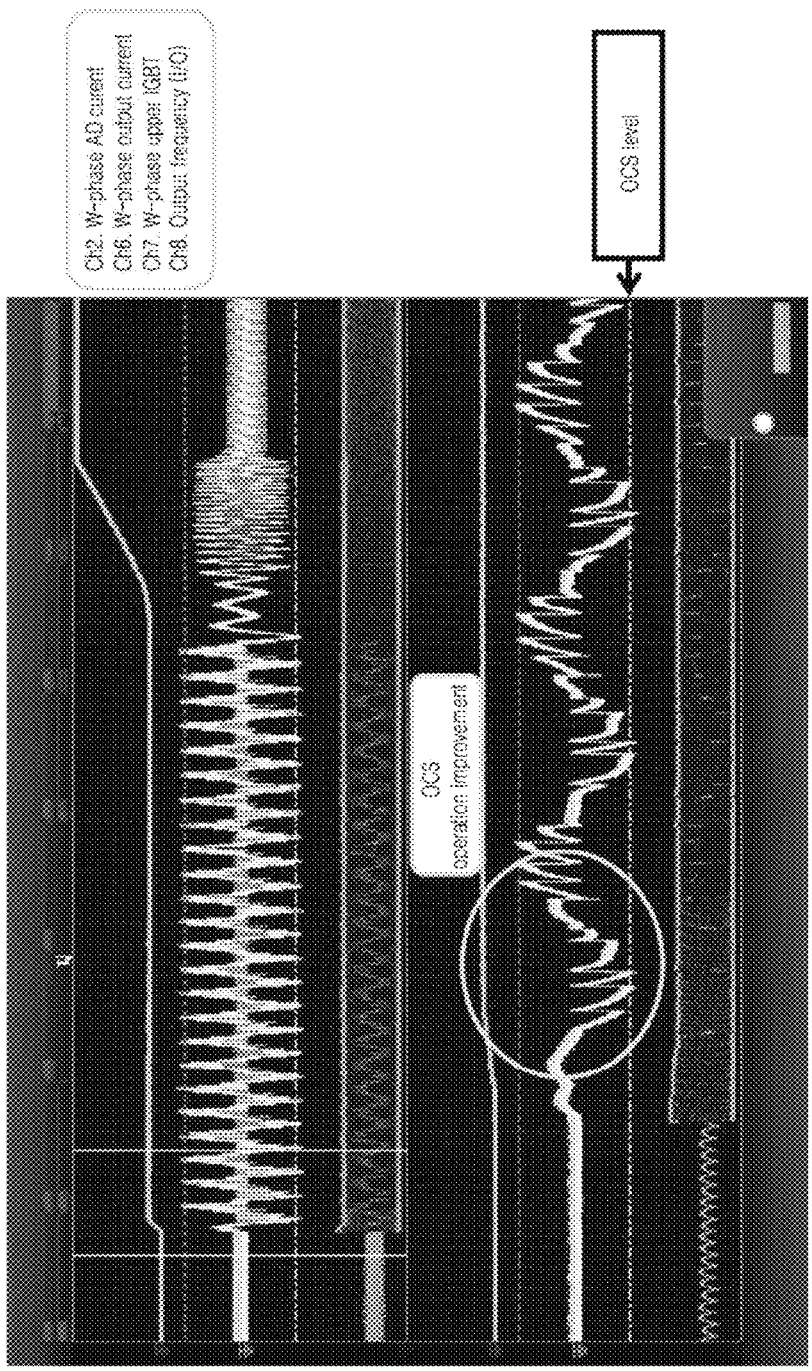
FIG. 9 is a current waveform of an overcurrent protection operation test result of a overcurrent protection inverter according to the present disclosure.
Figure 10:
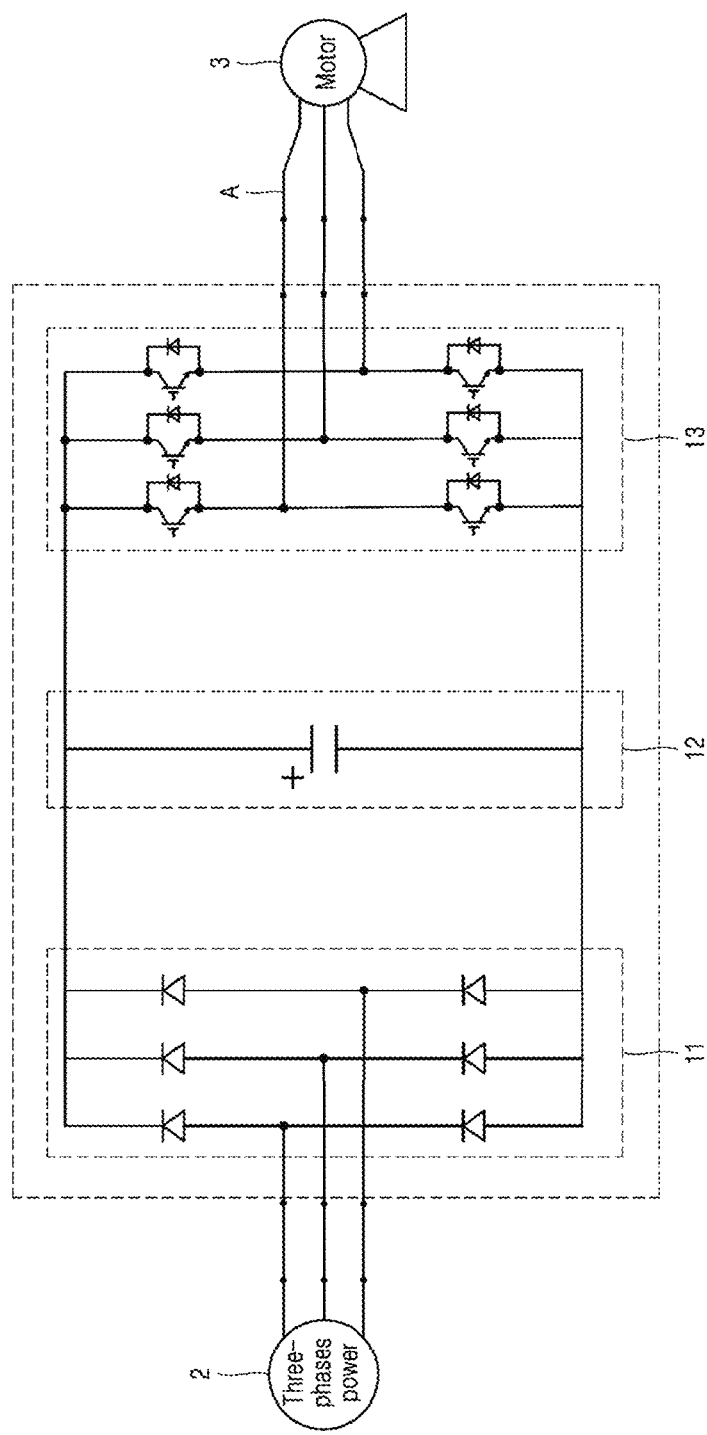
FIG. 10 is a configuration diagram of a general inverter according to a prior art.
Figure 11:
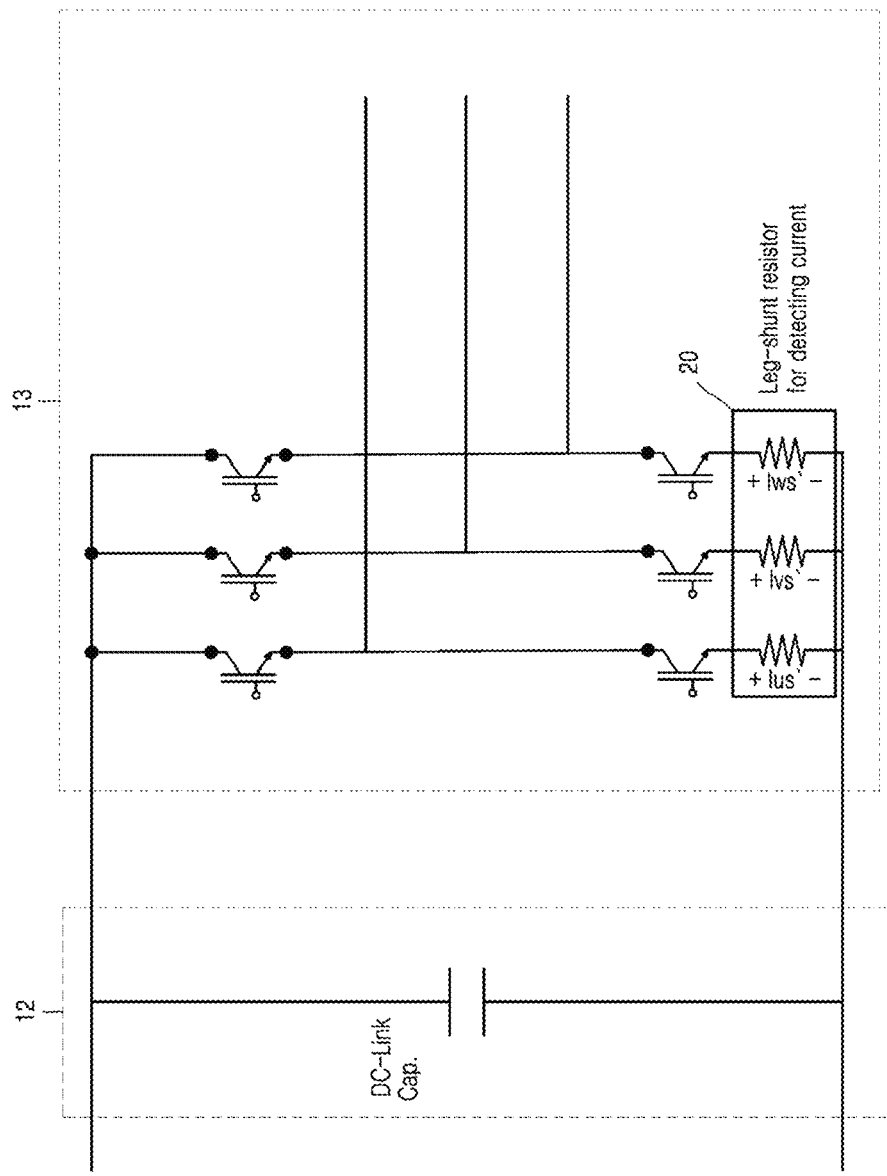
FIG. 11 is an exemplary diagram to illustrate a scheme for detecting inverter output current using a leg-shunt resistor according to a prior art.
Figure 12:
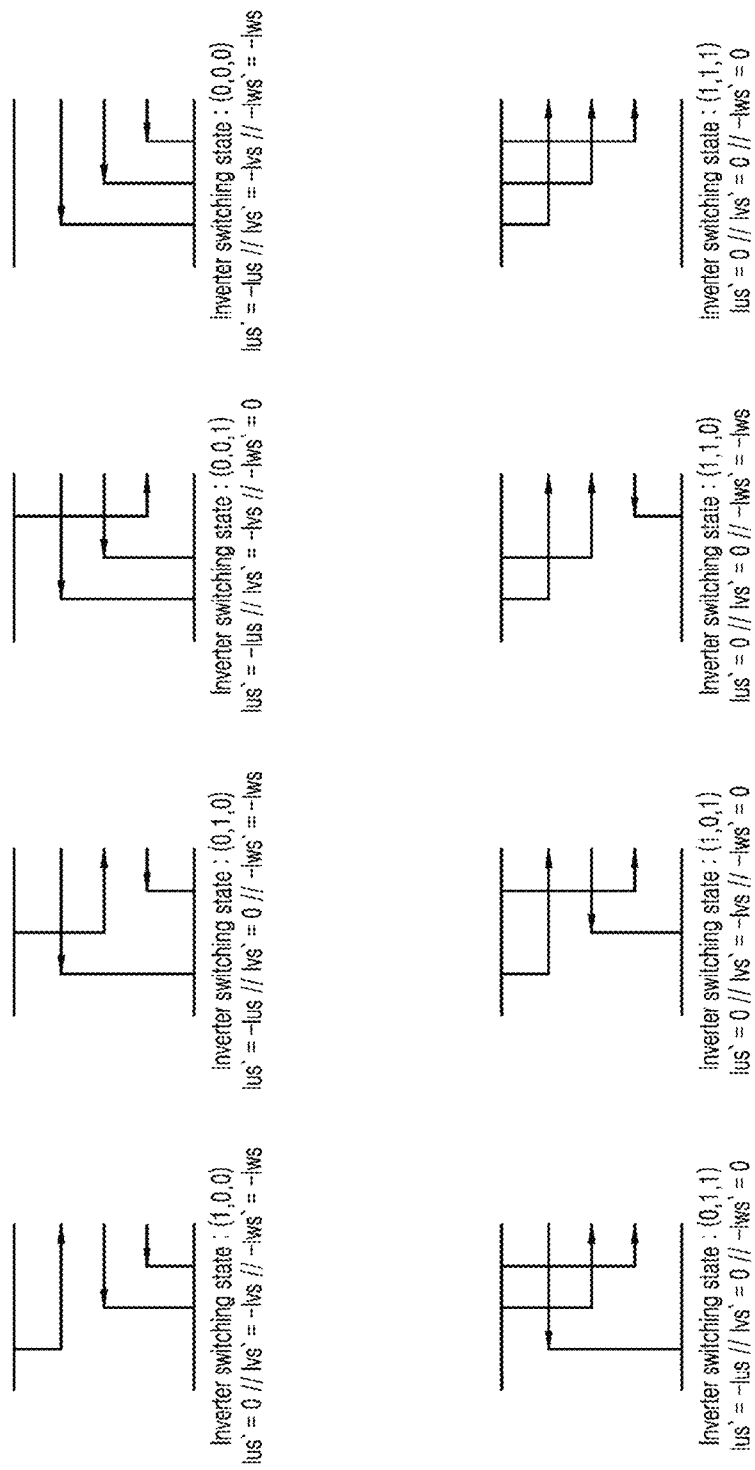
FIG. 12 is a state diagram of inverter output current based on a switching state in space vector pulse width modulation (SVPWM) control in a prior art.
Figure 13:
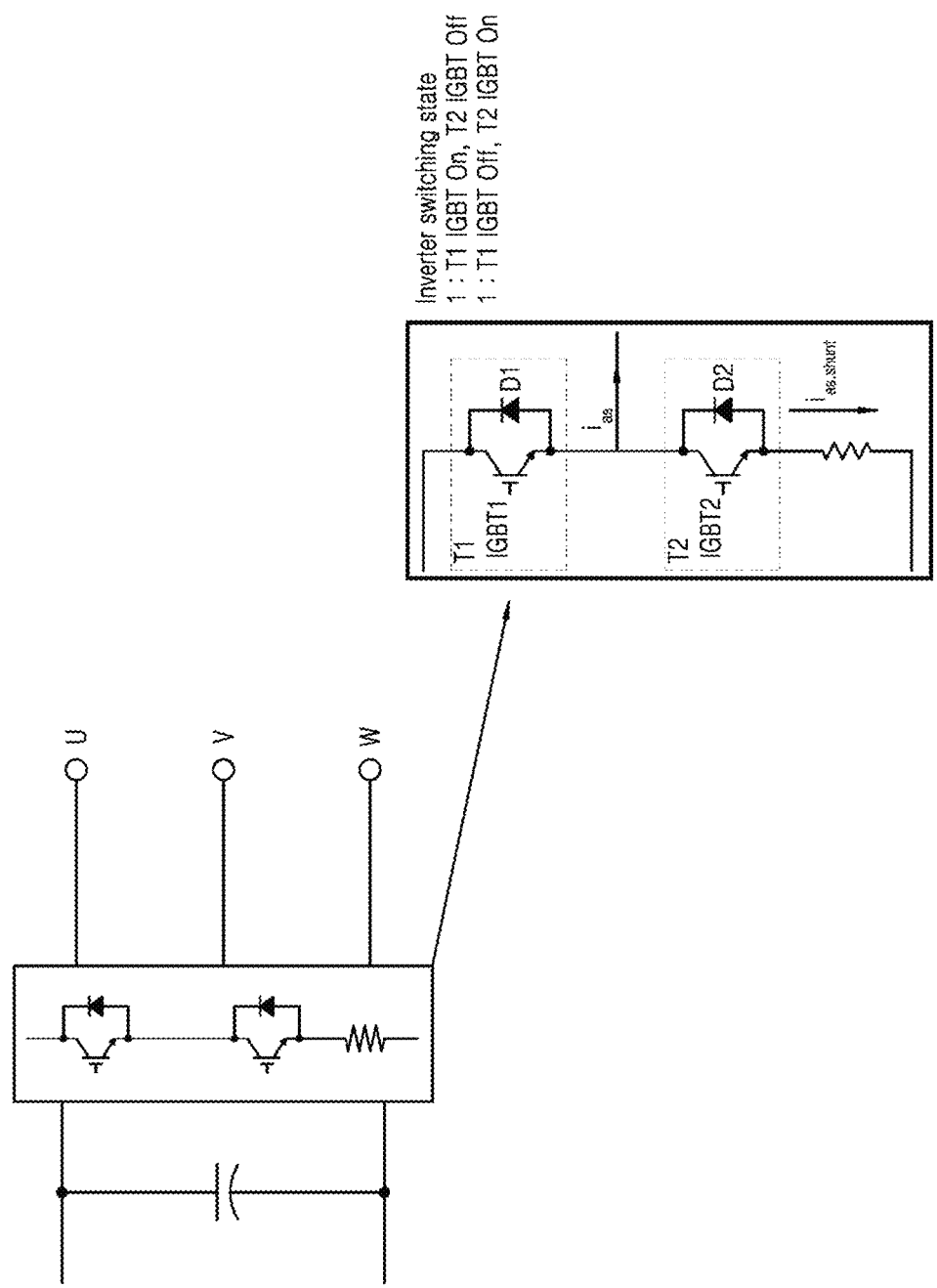
FIG. 13 shows an operation of a switching element based on an inverter switching state in a prior art.
Figure 15:
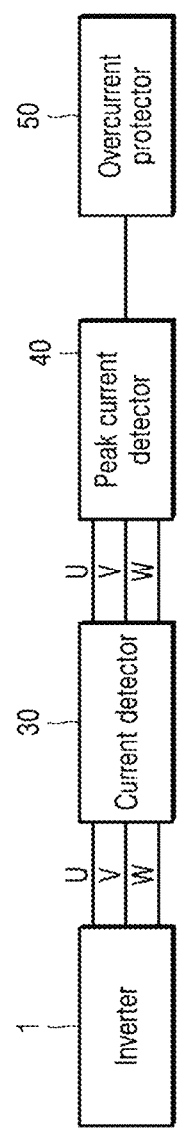
FIG. 15 is a configuration diagram of an inverter overcurrent protection system in a leg-shunt resistor current detection scheme according to a prior art.
Figure 16:
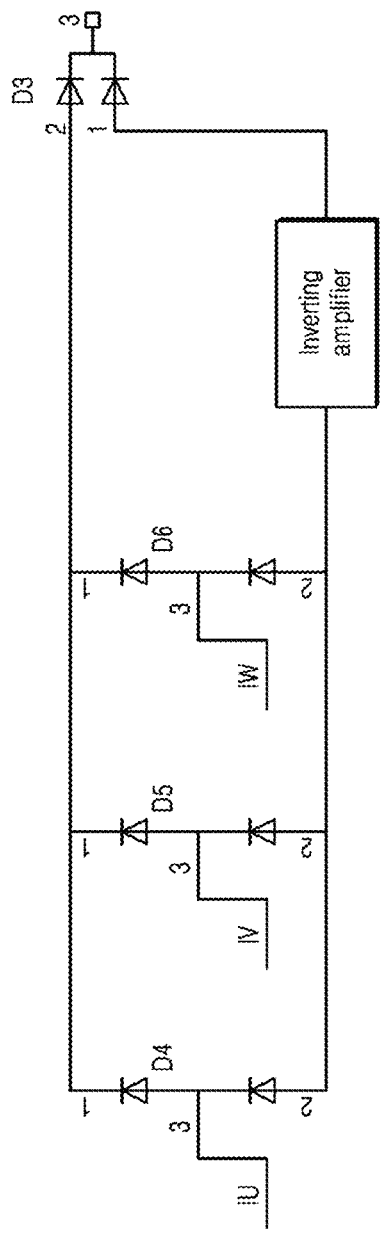
FIG. 16 is a detailed configuration diagram of a peak current detector of FIG. 15.
Figure 17:
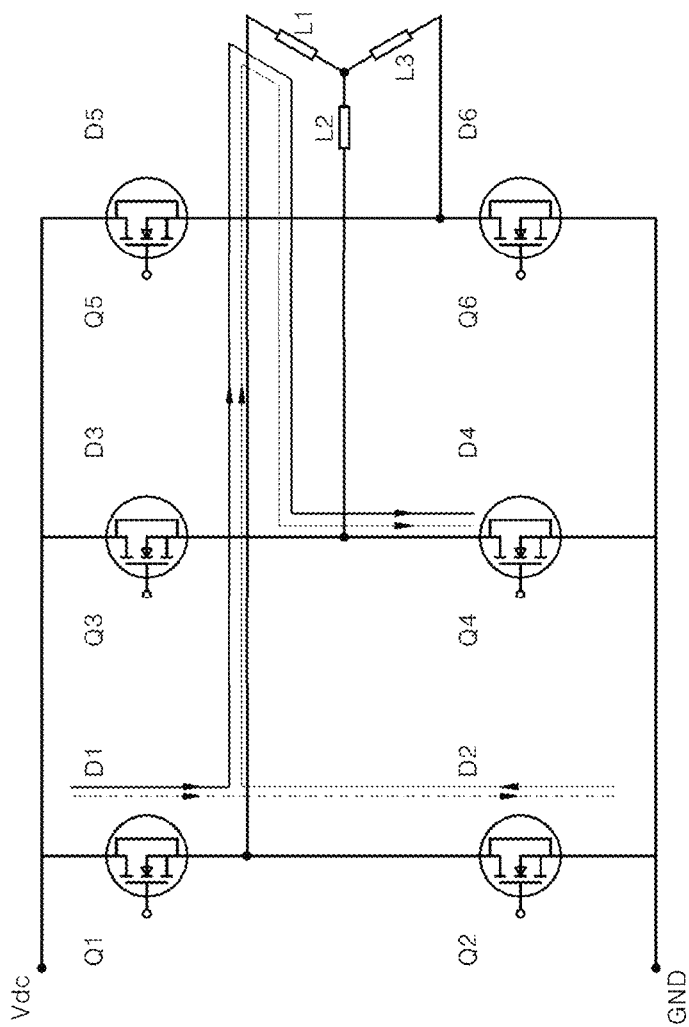
FIG. 17 is a diagram showing an output current path based on an inverter operation mode in a prior art.
Figure 18:
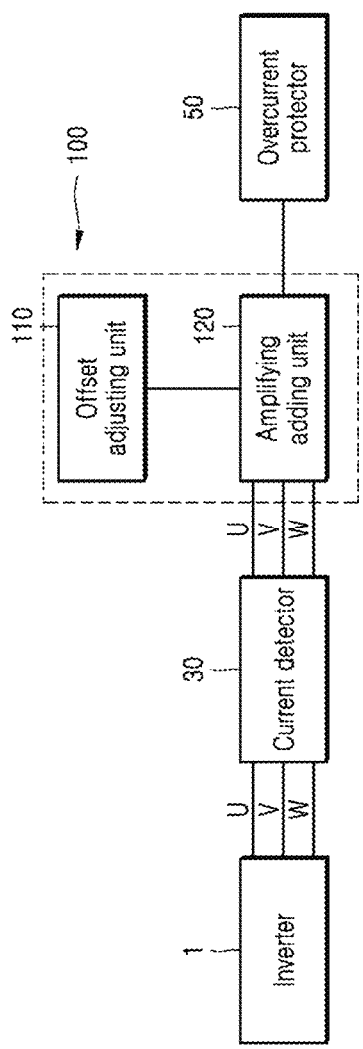
FIG. 18 is a configuration diagram of an inverter based on a maximum output current detection scheme (OP-AMP Adder scheme) according to a prior art.
Figure 19:
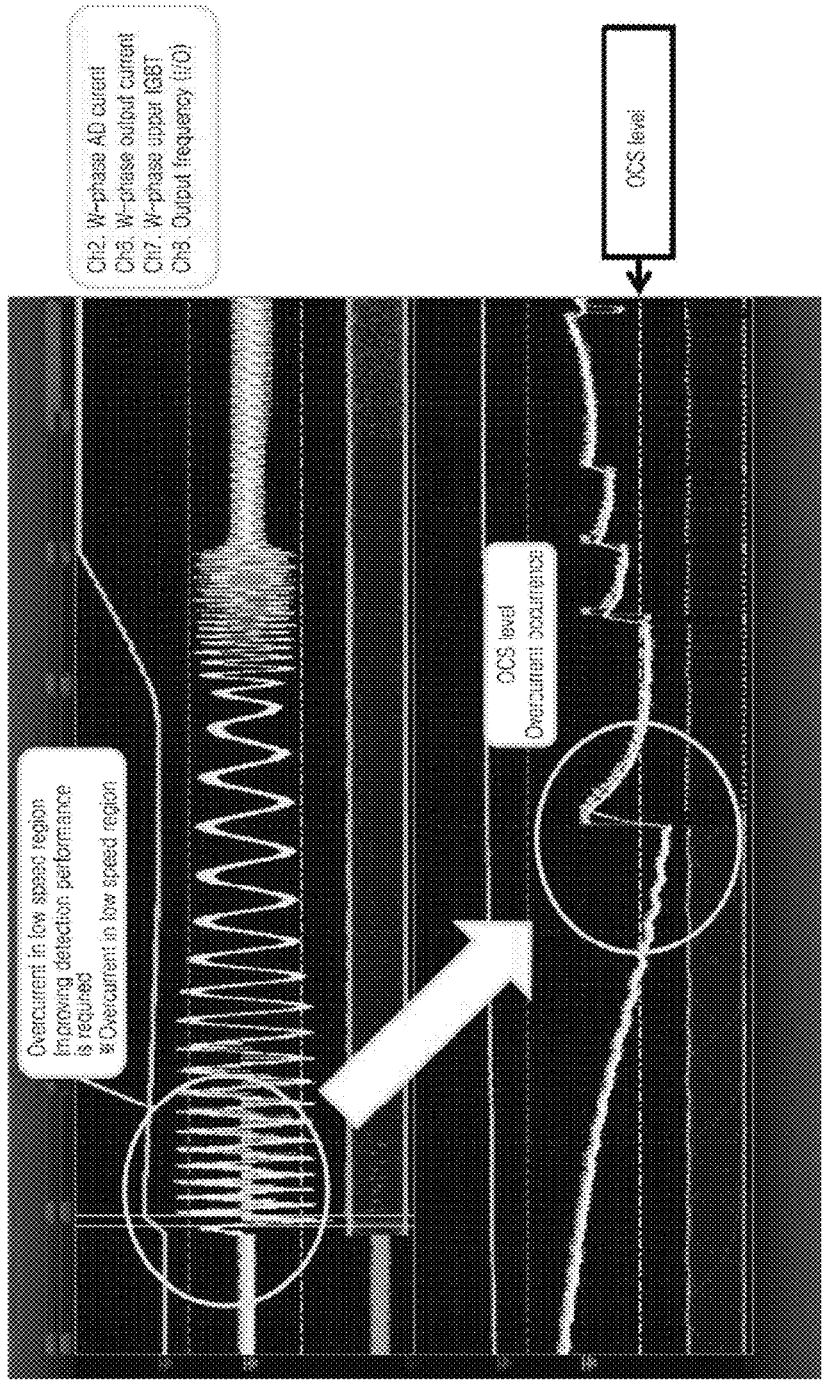
FIG. 19 is a current waveform of an inverter in which overcurrent is not detected, based on a maximum output current detection scheme according to a prior art.

Referring to Table 1, in the conventional AD current detection scheme, the conventional rectifying circuit scheme, and the conventional maximum output current detection scheme, the overcurrent detection is impossible for certain periods. However, the inverter according to the present disclosure may accurately detect the overcurrent for both the freewheeling mode period and the entirety of the powering mode period and thus safely protect the inverter from the overcurrent. FIG. 9 shows a current waveform of an overcurrent protection operation test result of the overcurrent protection inverter according to the present disclosure. The overcurrent protection inverter according to the present disclosure may accurately detect instantaneous maximum output current for an entire period including a period in which the active vector is large and a period for which the active vector is small. Thus, as shown in FIG. 9, it may be identified that the overcurrent protection inverter according to the present disclosure may perform reliable overcurrent protection operation even under high carrier and low speed operation conditions.

As described above, the present disclosure has been described with reference to the illustrated drawings. However, the present disclosure is not limited to the embodiments and drawings disclosed in the present specification. It is evident that various modifications may be made to the disclosure by those of ordinary skill in the art and within the scope of the technical idea of the present disclosure. In addition, although an effect of a configuration of the present disclosure has not been explicitly described above while illustrating the embodiments of the present disclosure, it is natural that an effect predictable from the configuration should also be appreciated.

What is claimed is:

1. An overcurrent protection inverter comprising:
   an inverting unit including two switching elements connected in series with each of legs;
   each leg-shunt resistor connected in series with a switching element of a lower leg of each leg of the inverting unit;
   a current detector configured to detect each output current from each signal output from each leg-shunt resistor;
   an instantaneous maximum output current detector configured to add the output currents received from the current detector to each other to output instantaneous maximum output current of output current of the inverting unit;
   a controller configured to:
      when each of output current detected by the current detector and the instantaneous maximum output current detected by the instantaneous maximum output current detector is equal to or greater than reference current, perform an overcurrent protection operation for protecting the inverting unit from overcurrent; and
   wherein the controller is further configured to:
      when each of the output current and the instantaneous maximum output current are equal to or greater than an over-current suppression (OCS) level, perform an OCS operation to temporarily block a Pulse Width Modulation (PWM) input of the inverting unit; or
      when each of the output current and the instantaneous maximum output current are equal to or greater than an over-current trip (OCT) level, perform an OCT operation to generate an inverter trip,
   wherein a magnitude of reference current for the OCS level is lower than a magnitude of reference current for the OCT level.

2. The overcurrent protection inverter of claim 1, wherein the overcurrent protection inverter comprises an overcurrent protection circuit configured to:
   when the instantaneous maximum output current detected by the instantaneous maximum output current detector is equal to or higher than the OCS level, transmit, to the controller, an OCS operation signal to temporarily block a PWM input of the switching element; or
   when the instantaneous maximum output current is equal to or higher than the OCT level, transmit, to the controller, an OCT operation signal to generate the inverter trip.

3. The overcurrent protection inverter of claim 2, wherein the instantaneous maximum output current detector includes an operational amplifier.

\* \* \* \* \*